United States Patent [19]

Kodera et al.

[11] Patent Number: 5,278,104
[45] Date of Patent: Jan. 11, 1994

[54] SEMICONDUCTOR WAFER CARRIER HAVING A DUST COVER

[75] Inventors: Masako Kodera, Matsudo; Tohru Watanabe; Katsuya Okumura, both of Yokohama, all of Japan

[73] Assignee: Kabushiki Kaisha Toshiba, Kawasaki, Japan

[21] Appl. No.: 870,240

[22] Filed: Apr. 20, 1992

Related U.S. Application Data

[63] Continuation of Ser. No. 557,015, Jul. 25, 1990, abandoned.

[30] Foreign Application Priority Data

Jul. 25, 1989 [JP] Japan ................ 1-192272

[51] Int. Cl.$^5$ .................. H01L 21/68; H01L 21/306
[52] U.S. Cl. .................. 437/250; 437/925; 118/500; 211/41
[58] Field of Search ............. 437/925, 250; 118/500; 211/41

[56] References Cited

U.S. PATENT DOCUMENTS

| | | | |
|---|---|---|---|
| 3,964,957 | 6/1976 | Walsh | 156/345 |
| 4,676,008 | 6/1987 | Armstrong | 211/41 |
| 4,696,395 | 9/1987 | Rivoli | 206/334 |

FOREIGN PATENT DOCUMENTS

| | | | |
|---|---|---|---|
| 2459892 | 9/1975 | Fed. Rep. of Germany . | |
| 58-17633 | 2/1983 | Japan | 29/25.01 |
| 60-16425 | 1/1985 | Japan | 29/25.01 |
| 61-8913 | 1/1986 | Japan | 437/925 |
| 61-12034 | 1/1986 | Japan . | |
| 61-67242 | 4/1986 | Japan | 437/925 |
| 61-161724 | 7/1986 | Japan | 29/25.01 |
| 61-170043 | 7/1986 | Japan | 29/25.01 |
| 170043 | 7/1986 | Japan . | |
| 62-291044 | 12/1987 | Japan . | |
| 63-213357 | 9/1988 | Japan | 437/925 |
| 63-227035 | 9/1988 | Japan | 437/925 |
| 851554 | 7/1981 | U.S.S.R. | 29/25.01 |
| 1046802 | 10/1983 | U.S.S.R. | 29/25.01 |

OTHER PUBLICATIONS

R. C. Guggenheim, Sr., et al.; *IBM Technical Disclosure Bulletin*, vol. 20, No. 6 Nov. 1977, p. 2205.
Hustis, et al., "Mask Transportation and Storage Container", *IBM Technical Disclosure Bulletin*, vol. 14, No. 8, Jan. 1972, p. 2317.

*Primary Examiner*—Olik Chaudhuri
*Assistant Examiner*—David E. Graybill
*Attorney, Agent, or Firm*—Foley & Lardner

[57] ABSTRACT

A semiconductor device support carrier used for a liquid phase process of a semiconductor device with a process liquid is disclosed. The semiconductor device support carrier comprises a support frame supporting the semiconductor device, and a dust protection plate mounted on the support frame and positioned above the semiconductor device. When the semiconductor device support carrier is drawn up from the process liquid, dust in the process liquid is pushed aside and out of the semiconductor device by the dust protection plate.

6 Claims, 3 Drawing Sheets

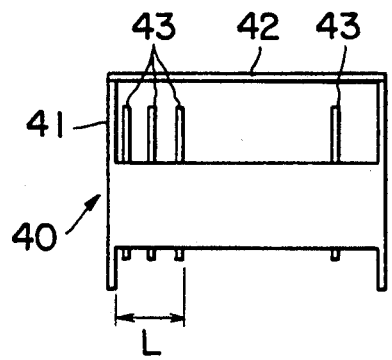
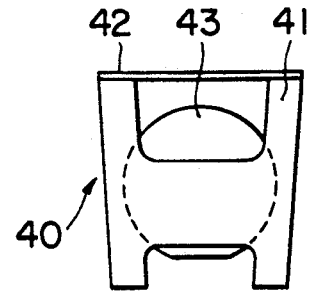
FIG. 1  FIG. 2
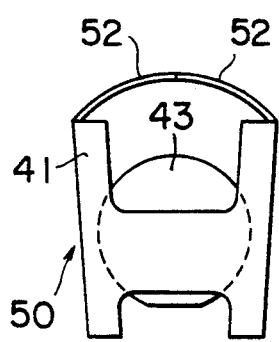
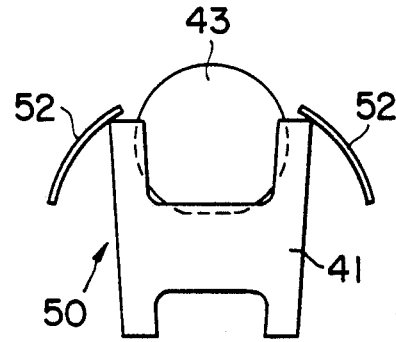
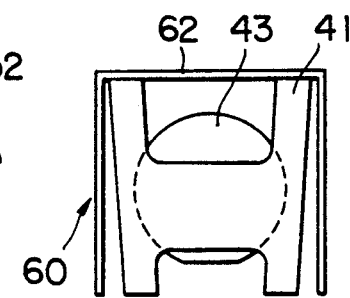
FIG. 3  FIG. 4  FIG. 5
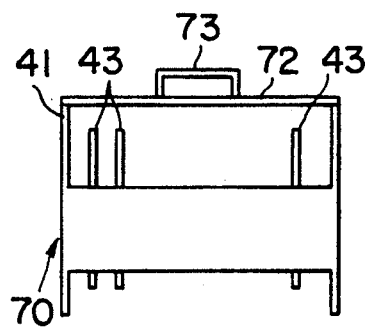
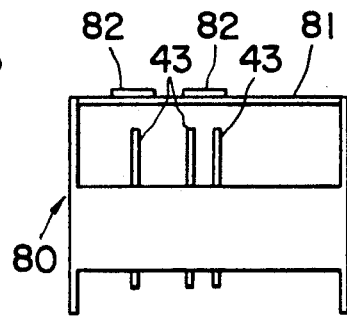
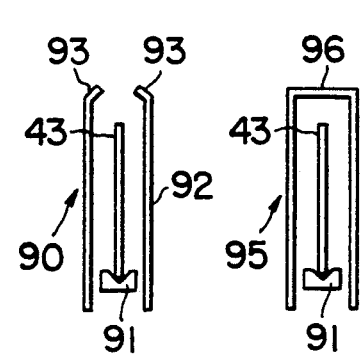
FIG. 6  FIG. 7  FIG. 8  FIG. 9

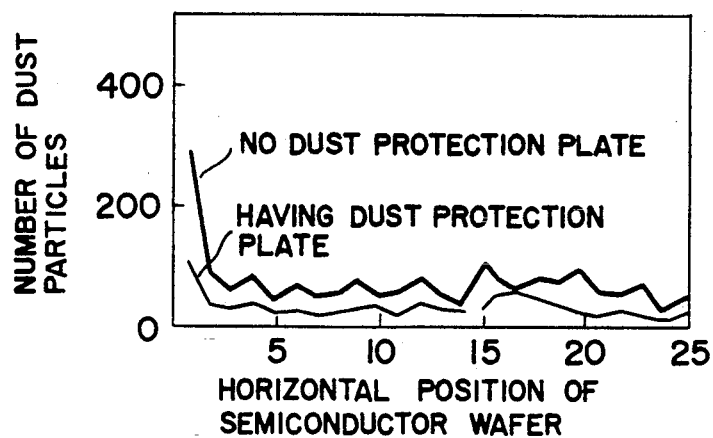
FIG. 10
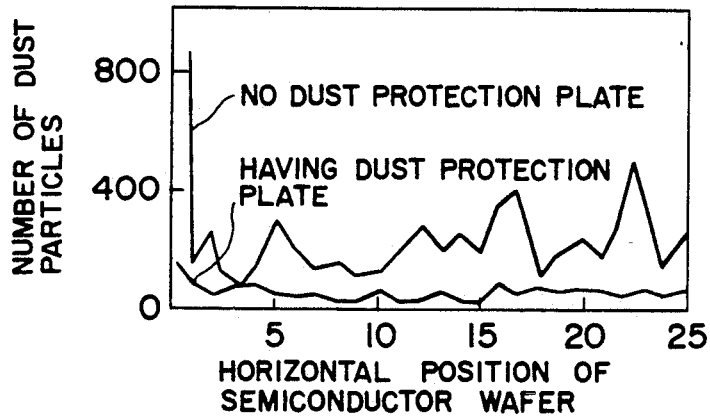
FIG. 11
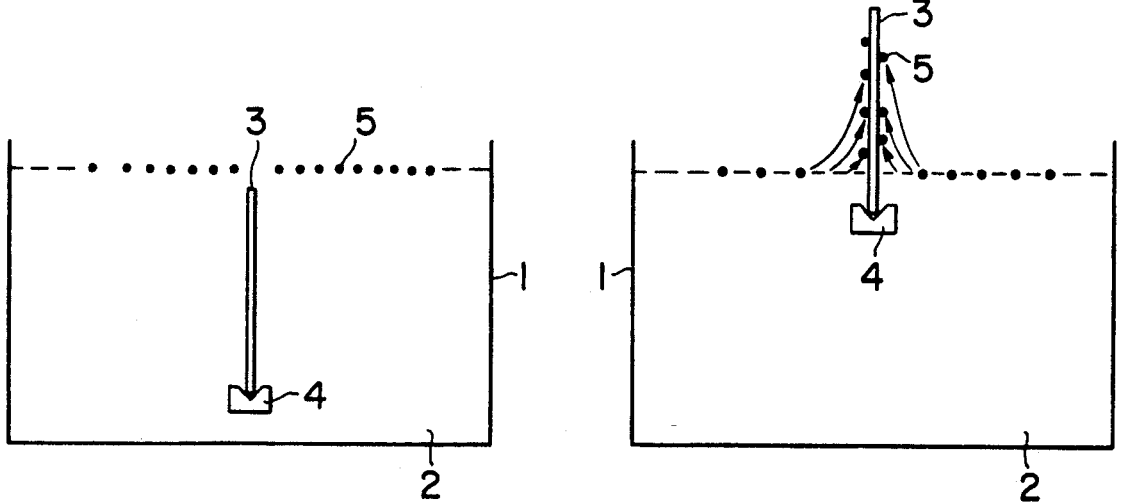
FIG. 12
PRIOR ART
FIG. 13
PRIOR ART

SEMICONDUCTOR WAFER CARRIER HAVING A DUST COVER

This application is a continuation of application Ser. No. 07/557,015, filed Jul. 25, 1990, now abandoned.

BACKGROUND OF THE INVENTION

The present invention relates to a semiconductor device support carrier used for a liquid phase process of semiconductor devices such as semiconductor wafers, and more particularly to a semiconductor device support carrier which prevents dust from adhering to the surfaces of semiconductor wafers.

In semiconductor device manufacturing processes, semiconductor devices such as the semiconductor wafers undergo a variety of liquid phase processes. For example, semiconductor wafers undergo a washing process which removes impurities from the surfaces of the semiconductor wafers, and they undergo an LPD process which forms an $SiO_2$ film on the surfaces of the semiconductor wafers by a precipitation reaction in a supersaturated solution.

In these liquid phase processes, the semiconductor wafers are supported by the semiconductor device support carrier, and the semiconductor device support carrier supporting the semiconductor wafers is put into and taken out of a process liquid.

However, when the semiconductor device support carrier is drawn up from the process liquid, it often happens that the dust and the like of the process liquid adheres to the surfaces of the semiconductor wafers. In this case, minute pattern forming processes and the like thereafter are affected by this adhering dust.

FIG. 12 shows a conventional semiconductor device support carrier.

In FIG. 12, a liquid phase process apparatus 1 contains process liquid 2. A conventional semiconductor device support carrier 4 supports semiconductor devices such as semiconductor wafers 3. The semiconductor wafers 3 are dipped within the process liquid 2, and much dust 5 floats on the surface of the process liquid 2. When the semiconductor wafers 3 are drawn up from the process liquid 2 by the semiconductor device support carrier 4 after the liquid phase process, the dust 5 on the surface of the process liquid 2 adheres to the surface of the semiconductor wafers 3.

In the semiconductor wafer washing process in which it is easy to secure the cleanliness of the process liquid 2, the amount of dust adhering to the surfaces of the semiconductor wafer and having diameters of over 0.3 μm, is in the order of several tens to several hundreds per semiconductor wafer having a diameter of 5 inches.

On the other hand, in a resist exfoliation process or LPD process in which it is easy for dust to form, the amount of dust per semiconductor wafer is about 100∼ about 1000 particles.

The dust adhering to the surfaces of the semiconductor wafer 3 causes much trouble in the minute pattern forming process of the semiconductor wafers thereafter.

These phenomena are shown in FIGS. 14∼16.

FIG. 14 shows the sectional side view of the semiconductor wafer. In FIG. 14, a numeral reference 6 is a substrate of the semiconductor wafer. A dust 5 adheres to the surface of the substrate 6 during the liquid phase process of the semiconductor wafer. After that, a wiring material 7 is formed on the surface of the substrate 6.

Next, wiring portions 8 are formed by etching the wiring material 7 of FIG. 14 (see FIGS. 15 and 16). FIGS. 15 and 16 show the top views of the semiconductor wafer.

However, it happens that the wiring portions 8 are separated by the dust 5 as shown in FIG. 15, when the wiring material 7 of FIG. 14 is etched. In this case, the wiring portions 8a and 8b which should be properly connected, are separated by the dust 5, so that the wiring formation of the semiconductor wafer becomes worse.

It also happens that the etching rest portion 8c remains as shown in FIG. 16, when the wiring material 7 of FIG. 14 is etched. In this case, the wiring portions 8d and 8e which should not normally be connected, are connected to each other through the etching rest portion 8c, so that the wiring formation of the semiconductor wafer deteriorates further.

The method where the dusts are discharged with the process liquid overflowing has been employed in order to prevent the dust from adhering. The amount of dust of the process liquid is decreased to some degree by the method as mentioned above, but the result of the method is not so apparent. This is because the dust 5 around the bottom of the process liquid is discharged but almost all the dust around the surface of the process liquid remains as shown in FIG. 17.

Thus, in the conventional liquid process, when the semiconductor device support carrier is drawn up from the process liquid, the dust 5 of the process liquid 2 adheres to the surfaces of the semiconductor wafers 3 so that the minute pattern forming process thereafter is affected by the dust which has adhered.

SUMMARY OF THE INVENTION

It is an object of the present invention to provide a semiconductor device support carrier which prevents dust from adhering to the surfaces of semiconductor wafers when the semiconductor wafers are drawn up from process liquid.

The foregoing object is accomplished by providing, a semiconductor device support carrier used for a liquid phase process of a semiconductor device with process liquid comprising; a support frame supporting the semiconductor device, and a dust protection plate mounted on the support frame and positioned above the semiconductor device, and a semiconductor device support carrier used for a liquid phase process of a semiconductor device with process liquid comprising; a support frame supporting the semiconductor device, and a pair of dust protection plates mounted on the support frame and positioned on both sides of the semiconductor device, the ends of the dust protection plates being bent inward.

In this invention, dust in the process liquid are pushed aside out of the semiconductor device by the dust protection when the semiconductor device support carrier is drawn up from the process liquid.

The preferred embodiments of the present invention will become understood from the following detailed description, referring to the accompanying drawings.

BRIEF DESCRIPTION OF THE DRAWINGS

FIG. 1 is a side view showing a first embodiment of a semiconductor device support carrier according to the present invention;

FIG. 2 is a front view showing the first embodiment;

FIGS. 3 and 4 are front views showing a second embodiment of the semiconductor device support carrier;

FIG. 5 is a front view showing a third embodiment of the semiconductor device support carrier;

FIG. 6 is a side view showing a fourth embodiment of the semiconductor device support carrier;

FIG. 7 is a side view showing a fifth embodiment of the semiconductor device support carrier;

FIG. 8 is a side view showing a sixth embodiment of the semiconductor device support carrier;

FIG. 9 is a side view showing a seventh embodiment of the semiconductor device support carrier;

FIGS. 10 and 11 are graphs showing the results of the present invention;

FIGS. 12 and 13 are side views showing a conventional semiconductor device support carrier;

DETAILED DESCRIPTION OF THE PREFERRED EMBODIMENTS

Figure 14:
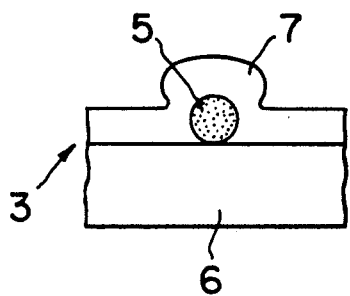
FIG. 14 is a sectional side view showing a semiconductor wafer which has dust inside a wiring material.
Figure 15:
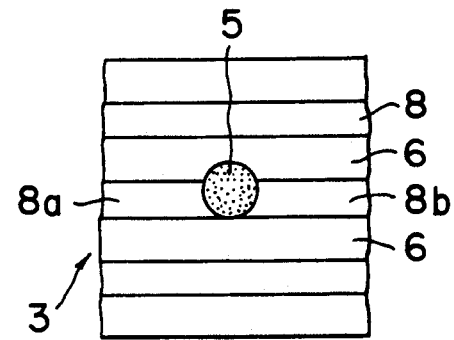
FIGS. 15 and 16 are plan views showing a semiconductor wafer which has dust inside a wiring portion.
Figure 16:
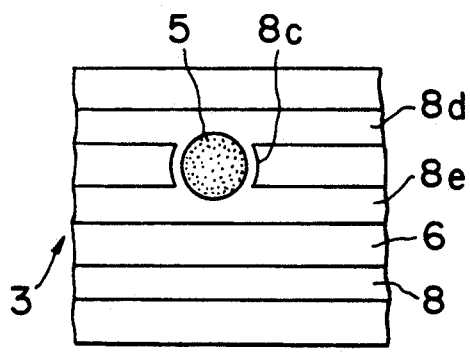
Figure 17:
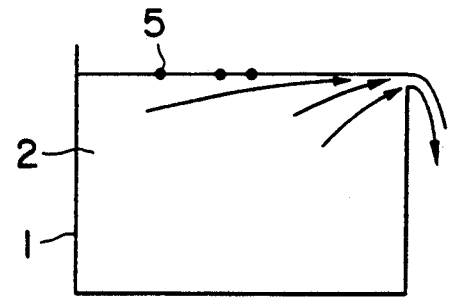
FIG. 17 is a side view showing the flow of the dust in the process liquid.

A first embodiment of a semiconductor device support carrier of the present invention will become understood from the following detailed description, with reference to the accompanying drawings, FIGS. 1 and 2.

As shown in FIGS. 1 and 2, the semiconductor device support carrier 40 is provided with a support frame 41 which contains a plurality of semiconductor wafers 43. The support frame 41 surrounds the semiconductor wafers 43. A dust protection plate 42 is mounted on the support frame 41. The dust protection plate 42 is positioned above the semiconductor wafers 43 so as to cover all of them. The operation of the semiconductor device support carrier according to the first embodiment is as follows.

When the semiconductor device support carrier 40 is drawn up from process liquid during a liquid phase process, dust in the process liquid is pushed aside out of the semiconductor wafers 43 by the dust protection plate 42. Therefore, the dust in the process liquid does not adhere to the surfaces of the semiconductor wafers 43 during the liquid phase process, so that later minute pattern forming process and the like semiconductor device manufacturing processes are not affected by the dust.

Next, two examples of the semiconductor device support carrier are indicated in FIGS. 10 and 11.

FIG. 10 shows the result of the first example. In this case, a semiconductor wafer washing process which removes impurities from the surfaces of the semiconductor wafers, is carried out as the liquid phase process.

In FIG. 10, the horizontal position of the semiconductor wafer is taken along the horizontal axis, and the number of dust particles is taken along the vertical axis. In this case, the horizontal position of the semiconductor wafer means for example the position which is away at a distance L from the left end of the carrier 40. Moreover, the amount of dust which adheres to the surfaces of each semiconductor wafer and has diameters of over 0.3 $\mu$m, was measured. Semiconductor wafers having diameters of 5 inches were used. As is clear in FIG. 10, the amount of dust is reduced drastically in the case of a semiconductor support carrier having a dust protection plate according to the present invention, as compared with in the case of the conventional carrier. (For example, about several tens to three hundred particles of dust was reduced to about thirty).

FIG. 11 shows the results of the second example. In this case, the LPD process which forms $SiO_2$ films on the surfaces of the semiconductor wafers by a precipitating reaction of a supersaturated solution, is carried out as the liquid phase process.

In FIG. 11, the horizontal position of the semiconductor wafer is taken along the horizontal axis, and the number of dust particles is taken along the vertical axis, as is similar to in FIG. 10. In the FIG. 11 the number of dust particles which have diameters of over 0.3 $\mu$m and which adhere to the surfaces of the semiconductor wafers, are shown. Semiconductor wafers having diameters of 5 inches are used.

As is clear in FIG. 11, the amount of dust is reduced in the case of the semiconductor support carrier having the dust protection plate according to the present invention, as compared with in the case of the conventional carrier. (For example, from one hundred to one thousand particles of dust to about several tens.)

Next, a second embodiment of the semiconductor device support carrier of the present invention is shown in FIGS. 3 and 4.

In FIGS. 3 and 4, a semiconductor device support carrier 50 is provided with a support frame 41 which contains and surrounds a plurality of semiconductor wafers 43. A dust protection plate 52 is mounted on the support frame 41, and is positioned above the semiconductor wafers 43 so as to cover all of them. The dust protection plate 52 consists of two parts each sliding on the top of the support frame 41.

In this embodiment, it is easy to take the semiconductor wafers 43 in and out of the semiconductor device support carrier 50, by separating the two parts of the dust protection plate 52 before and after the liquid phase process (see FIG. 4).

Next, a third embodiment of the semiconductor device support carrier of the present invention is shown in FIG. 5.

In FIG. 5, a semiconductor device support carrier 60 is provided with a support frame 41 which contains and surrounds a plurality of semiconductor wafers 43. A dust protection plate 62 is mounted on the support frame 41. The dust protection plate 62 covers the upper portions and the side portions of the semiconductor wafers 43.

In this embodiment, the adhering of dust to the surfaces of the semiconductor wafers 43 is definitely prevented.

Next, a fourth embodiment of the semiconductor device support carrier of the present invention is shown in FIG. 6.

In FIG. 6, a semiconductor device support carrier 70 is provided with a support frame 41 which contains and surrounds a plurality of semiconductor wafers 43. A dust protection plate 72 which covers there upper portions of the semiconductor wafers 43 is detachably mounted on the support frame 41. A handle 73 is secured to the dust protection plate 72. It is easy to detach the dust protection plate 72 from the support frame 41 by grasping the handle 73.

Next, a fifth embodiment of the semiconductor device support carrier of the present invention is shown in FIG. 7.

In FIG. 7, a semiconductor device support carrier 80 is provided with a support frame 41 which contains and surrounds a plurality of semiconductor wafers 43. Several dust protection plate 82 are mounted on the support frame 41 through support member 81. Each dust protection plate 82 covers the upper portions of one or more than two semiconductor wafers 43.

In this embodiment, the adhering of dust to the surfaces of the specific semiconductor wafers 43 is definitely prevented.

Next, a sixth embodiment of the semiconductor device support carrier of the present invention is shown in FIG. 8.

In FIG. 8, a semiconductor device support carrier 90 is provided with a support frame 91 which supports a plurality of semiconductor wafers 43. A pair of dust protection plates 92 which cover the side portions of the semiconductor wafers 43, are mounted on the support frame 91 through a connection member (not shown). The upper ends 93 of the dust protection plates 92 are bent inward, and partially cover the upper portions of the semiconductor wafers 43.

When the semiconductor device support carrier 90 is drawn up from the process liquid during the liquid phase process, the process liquid is pushed aside by the bending upper ends 93, and the dust in the process liquid is also pushed aside. It is easy to take the semiconductor wafers 43 in and out of the semiconductor device support carrier 90 through the space between the upper ends 93 of the dust protection plate 92.

Next, a seventh embodiment of the semiconductor device support carrier of the present invention is shown in FIG. 9.

In FIG. 9, a semiconductor device support carrier 95 is provided with a support frame 91 which supports a plurality of semiconductor wafers 43. A dust protection plate 96 is mounted on the support frame 91 through a connection member (not shown). The dust protection plate 96 covers the side and upper portions of the semiconductor wafers 43.

What is claimed is:

1. A method of protecting a plurality of semiconductor wafers from dust in a process liquid, comprising the steps of:

positioning said semiconductor wafers vertically in a support frame;

mounting a dust protection plate horizontally on top of said support frame, wherein said dust protection plate entirely covers each said semiconductor wafer;

lowering said support frame into said process liquid; and raising said support frame from said process liquid, wherein said dust in said process liquid is pushed aside out of said semiconductor wafers.

2. A semiconductor device support carrier for use in a liquid phase process of semiconductor wafer processing with a process liquid, said carrier comprising:

a support frame supporting a plurality of semiconductor wafers such that said semiconductor wafers are positioned in a vertical direction, and a dust protection plate mounted on said support frame and positioned in a horizontal direction above, and in a perpendicular direction to, said semiconductor wafers so as to entirely cover each said semiconductor wafer, such that dust in said process liquid is pushed away from said semiconductor wafers when said support frame is drawn up.

3. The semiconductor device support carrier as claimed in claim 2, wherein said dust protection plate consists of two parts.

4. The semiconductor device support carrier as claimed in claim 3, wherein said two parts are able to slide on said support frame.

5. The semiconductor device support carrier as claimed in claim 2, wherein said dust protection plate is detachably mounted on said support frame and a handle is secured to said dust protection plate.

6. A semiconductor device support carrier for use in a liquid phase process of semiconductor wafer processing with a process liquid, said carrier comprising:

a support frame so supporting a semiconductor wafer and having both surfaces parallel to the wafer such that said semiconductor wafer is positioned in a vertical direction, and a pair of dust protection plates mounted on said support frame and positioned in a vertical direction so as to entirely cover both of the surfaces of each said semiconductor wafer, said dust protection plates having upper ends which are bent inward and in a direction perpendicular to said semiconductor wafer.

* * * * *